United States Patent
Schulze

(10) Patent No.: US 6,683,328 B2
(45) Date of Patent: Jan. 27, 2004

(54) POWER SEMICONDUCTOR AND FABRICATION METHOD

(75) Inventor: Hans-Joachim Schulze, Ottobrunn (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/840,549

(22) Filed: Apr. 23, 2001

(65) Prior Publication Data

US 2001/0042870 A1 Nov. 22, 2001

Related U.S. Application Data

(63) Continuation of application No. PCT/DE99/03395, filed on Oct. 22, 1999.

(30) Foreign Application Priority Data

Oct. 23, 1998 (DE) .......................... 198 48 984

(51) Int. Cl.$^7$ .................... H01L 29/74; H01L 31/111
(52) U.S. Cl. ............................ 257/107; 438/133
(58) Field of Search ................. 257/229, 213, 257/215, 225, 400, 216, 263, 278, 577, 586, 43, 42, 302, 329, 330, 328

(56) References Cited

U.S. PATENT DOCUMENTS

| | | | |
|---|---|---|---|
| 2,809,165 A | | 10/1957 | Jenny |
| 2,954,308 A | | 9/1960 | Lyons |
| 4,450,469 A | * | 5/1984 | Yamamoto .............. 357/56 |
| 4,605,944 A | * | 8/1986 | Ishii et al. ............... 357/17 |
| 4,672,738 A | | 6/1987 | Stengl et al. |
| 4,865,655 A | * | 9/1989 | Fujita et al. .............. 148/33 |
| 4,901,131 A | * | 2/1990 | Takahashi ................ 357/43 |
| 5,374,571 A | * | 12/1994 | Mukherjee et al. ......... 437/41 |
| 5,486,718 A | * | 1/1996 | Robb et al. ............... 257/630 |
| 5,528,063 A | * | 6/1996 | Blanchard ................ 257/335 |
| 5,712,502 A | * | 1/1998 | Mitlehner et al. .......... 257/341 |
| 5,760,462 A | * | 6/1998 | Barron et al. ............. 257/629 |
| 5,949,124 A | * | 9/1999 | Hadizad et al. ........... 257/496 |
| 5,959,345 A | * | 9/1999 | Fruth et al. .............. 257/605 |
| 5,986,289 A | * | 11/1999 | Simmonet ............... 257/109 |
| 6,259,134 B1 | * | 7/2001 | Amaratunga et al. ...... 257/330 |
| 6,281,521 B1 | * | 8/2001 | Singh .................... 257/77 |

FOREIGN PATENT DOCUMENTS

| | | |
|---|---|---|
| DE | 195 31 369 A1 | 2/1997 |
| JP | 404263465 A * | 9/1992 |

OTHER PUBLICATIONS

Ben G.Streetman and Sanjay Banerjee, Solid State Electronic Devices 2000, Prentice Hall, Inc., Fifth Edition, p. 149.*

* cited by examiner

Primary Examiner—Long Pham
Assistant Examiner—Dana Farahani
(74) Attorney, Agent, or Firm—Laurence A. Greenberg; Werner H. Stemer; Ralph E. Locher

(57) ABSTRACT

A power semiconductor containing an anode disposed on either a top side or a bottom side is described. A cathode is disposed on the side that is unoccupied by the anode, and edge terminations are provided on the top side. The power semiconductor is characterized in that at least one region extends from an edge termination on the top side to a semiconductor region on the bottom side in order to form an ohmic connection, and is characterized in that this at least one region is doped with sulfur.

25 Claims, 1 Drawing Sheet

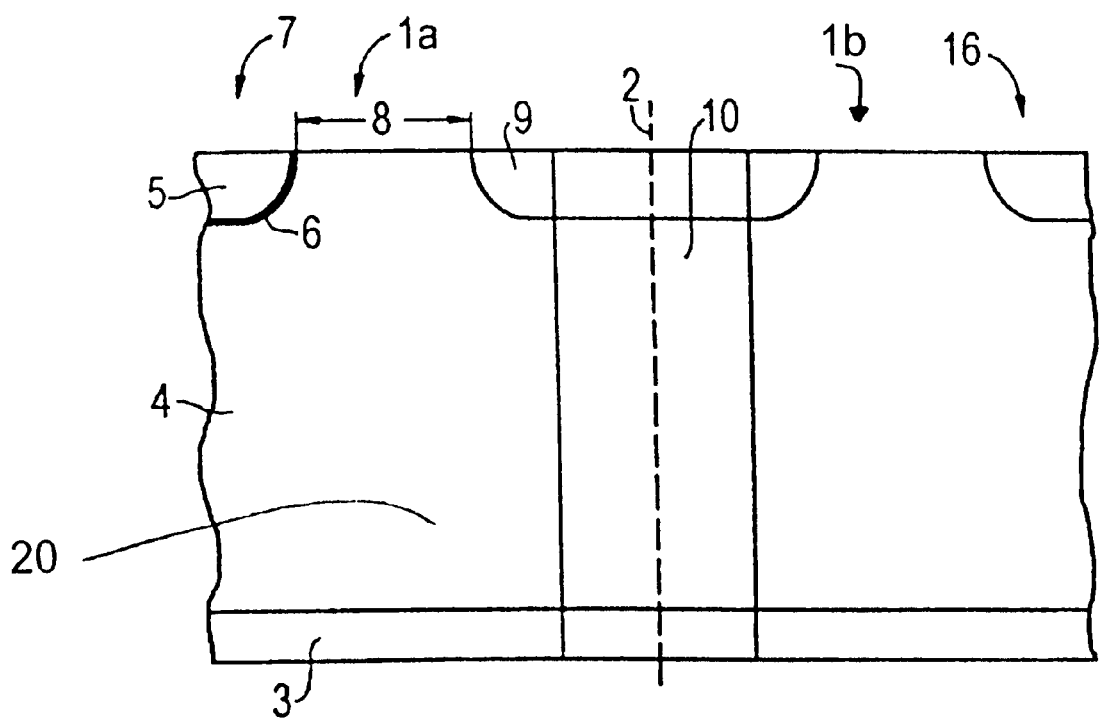

POWER SEMICONDUCTOR AND FABRICATION METHOD

CROSS-REFERENCE TO RELATED APPLICATION

This application is a continuation of copending International Application No. PCT/DE99/03395, filed Oct. 22, 1999, which designated the United States.

BACKGROUND OF THE INVENTION

Field of the Invention

The present invention relates to a power semiconductor having a substrate with an anode disposed on one side of the substrate, a cathode disposed on the opposite side of the substrate, and edge terminations provided on a top side of the substrate.

In the case of power semiconductors, it is necessary to form the components in such a way that they can withstand the voltages that typically accompany high powers. If no forward current flows through the power component, these voltages are dropped entirely across the semiconductor and must accordingly be blocked. In this case, very large field strengths build up between differently doped regions, in particular at the edges of the semiconductor where the edge terminations of the blocking p–n junctions are situated. Reference is made, only by way of example, to U.S. Pat. No. 4,672,738 with regard to the formation of such edge terminations.

If a power semiconductor is intended to block both in the forward direction and in the reverse direction, it is necessary to provide in each case corresponding edge terminations both for the p–n junction that blocks in the forward direction and for the junction that blocks in the reverse direction. In the case of power semiconductors having a very large area, this can be realized by mechanical processing of the edge regions. To that end, the components can be lapped or sand-blasted in order to produce e.g. what are called positive or negative angles which bring about a reduction in the electric field strength in the edge region in the event of blocking voltage loading as a result of widening of the space charge zone.

The mechanical edge termination is not practical with small components because this type of processing results in an excessively high outlay relative to the other fabrication costs and would additionally necessitate going over to a round power semiconductor. Moreover, there are power semiconductors in which comparatively small penetration depths are used at the p–n junctions, for example in insulated gate bipolar transistors (IGBTs). The small penetration depths used there would necessitate very fine mechanical processing. This also largely precludes the use of mechanically produced edge terminations in these components.

In principle, it is possible to provide respective edge terminations on both sides of a planar power semiconductor. However, this is generally undesirable because the realization of an edge termination on the anode side requires comparatively complex passivation and contact-making. A further possibility is to provide the edge terminations only on one side, the top side of the component, and to produce an ohmic connection to the underside via a connection region made of indiffused material. The material used here in the prior art is, by way of example, boron or aluminum, which diffuses more rapidly. The completed semiconductor can be separated, for example by sawing, at the locations at which the aluminum is introduced into the semiconductor during production in order to conductively connect an edge termination on the top side to the underside of the semiconductor. For this reason, a term that is also employed is separation diffusion.

In the prior art, however, the high loading on the semiconductor material is disadvantageous in the fabrication of separation diffusion, the loading being caused by the required diffusion temperatures of around 1240° C. and the long drive-in times during which the semiconductor substrate has to be kept at the diffusion temperature. Drive-in times of at least 50 hours are customary even with wafer thicknesses of just 300 micrometers. A further problem associated with the formation of separation diffusion by aluminum is that the latter cannot be masked by silicon dioxide, $SiO_2$. For this reason, in principle no aluminum diffusion is performed, as a rule, in semiconductor production lines for ICs because of the fear in this case that the lack of maskability may lead to cross-contamination in later operation of the production line, for example as a result of impairment of a gate oxide.

SUMMARY OF THE INVENTION

It is accordingly an object of the invention to provide a power semiconductor and a fabrication method which overcome the above-mentioned disadvantages of the prior art devices and methods of this general type.

With the foregoing and other objects in view there is provided, in accordance with the invention, a power semiconductor. The power semiconductor contains a substrate having a top side and an underside, an anode disposed on the top side or the underside, a cathode disposed on the other of the top side and the underside, edge terminations disposed on the top side, and at least one doped region disposed in the substrate and extending from one of the edge terminations on the top side to the underside of the substrate. The doped region is continuously sulfur-doped or selenium-doped.

A basic concept of the present invention thus consists in simplifying the formation of edge terminations exclusively on one side of the semiconductor substrate by providing a doped region which is continuous from top to bottom for the purpose of producing an ohmic connection. The region is doped with sulfur or selenium. It has been recognized that such sulfur or selenium doping which extends from an edge termination on the top side to a semiconductor region on the underside has considerable advantages over previously known dopings of separation diffusion regions. Sulfur, in particular, has the advantage that the diffusion rate in silicon is very high, which makes it possible to perform the doping with sulfur by indiffusion at low temperatures and/or for short times. This not only reduces the material loading but also allows economic utilization of production lines and faster fabrication of a semiconductor overall. While selenium also has the n-doping properties that are suitable for the invention, the use of sulfur is preferable for the reason mentioned.

The invention makes it possible to shift all the edge terminations to the top side and nevertheless fabricate the power semiconductor simply and rapidly. Preferably, every edge termination may be formed by a doping, for example as doping with lateral concentration variation as described in U.S. Pat. No. 4,672,738 cited above.

The preferably sulfur-doped or else selenium-doped region is typically provided at an edge of the completed power semiconductor, in order to produce a connection to the underside from an edge termination for the reverse blocking capability. It is possible to form the sulfur-doped or selenium-doped region with a width such that a semiconductor wafer can conveniently be sawn at this location. The sulfur-or selenium-doped region is then situated at a sawing edge. Since the sulfur-doped or selenium-doped region has donor properties, that is to say has n-type conductivity, the lightly doped base zone required for realizing the blocking voltage sought will be correspondingly p-doped. The second, more highly doped base zone will therefore be correspondingly n-doped. Furthermore, in the case of a thyristor structure, the cathodal emitter will be p-doped and the anodal emitter, which is typically situated on the underside, will be n-doped.

Given typical thicknesses and basic dopings of the silicon substrate, it is sufficient for approximately $10^{14}$ to $10^{16}$ atoms/cm$^2$ to be indiffused as implantation dose into the substrate. The surrounding regions to be protected from the sulfur implantation can be masked with photoresist or silicon dioxide in a simple manner. The masking layer thickness may be 1 micrometer, for example, which suffices from experience. The simple masking allows sulfur or selenium to be driven into the silicon from both substrate sides. In this way, the diffusion time can be reduced to approximately one quarter compared with indiffusion only from one side.

In accordance with an added feature of the invention, the edge terminations are disposed only on the top side.

In accordance with an additional feature of the invention, at least one of the edge terminations is formed by doping with a lateral concentration variation.

In accordance with another feature of the invention, the doped region extends to the edge termination intended for obtaining a reverse blocking capability.

In accordance with a further feature of the invention, the doped region is disposed at a n edge of the power semiconductor.

In accordance with a further added feature of the invention, the substrate has a sawing line defined thereon, and the doped region is disposed at the sawing line of the substrate.

In accordance with a further additional feature of the invention, the doped region extends in a transverse direction by at least twice, three times or four times, a penetration depth of a space charge zone into the doped region.

In accordance with another further feature of the invention, the doped region is doped so highly that an ohmic connection is produced with, in comparison with its surroundings, an appreciable conductivity between the one of the edge terminations and the underside of the substrate.

In accordance with another added feature of the invention, the doped region is formed by indiffusion of an implantation dose of between $10^{14}$ and $10^{16}$ dopant atoms per square centimeter.

In accordance with another additional feature of the invention, a lightly p-doped base zone is disposed in the substrate.

In accordance with yet another feature of the invention, a more highly doped base zone is n-doped and is disposed in the substrate.

In accordance with a feature of the invention, the cathode is a p-doped cathodal emitter and the anode is an n-doped anodal emitter.

In accordance with yet a further feature of the invention, the edge terminations are disposed on a side of the substrate containing the cathode and the substrate is composed of silicon.

In accordance with a concomitant feature of the invention, all of the edge terminations are formed by doping with a lateral concentration variation.

With the foregoing and other objects in view there is provided, in accordance with the invention, a method for fabricating a power semiconductor. The method includes the steps of: providing a substrate being a planar silicon substrate; forming a first power terminal on a top side or an underside of the substrate; forming a second power terminal on the other of the top side and the underside of the substrate; providing edge terminations for both blocking directions on the top side of the substrate; forming a connection connecting a semiconductor region on the underside to an edge termination on the top side; and forming the connection from dopant atoms being either sulfur atoms or selenium atoms indiffused into the substrate.

In accordance with an added mode of the invention, there is the step of indifussing an implantation dose of $10^{14}$ to $10^{16}$ dopant atoms into the substrate for forming the connection.

In accordance with an additional mode of the invention, there is the step of indifussing the dopant atoms into the substrate from both substrate sides.

In accordance with a further mode of the invention, there is the step of indiffussing the dopant atoms at a temperature below 1240° C., in particular below 1200° C., and during a time shorter than 50 hours.

In accordance with another mode of the invention, there is the step of masking both of the substrate sides on which the dopant atoms are to be implanted using a masking layer. The masking layer is formed from a material being either silicon dioxide or photoresist.

In accordance with a concomitant mode of the invention, there is the step of stripping off the masking layer before performing the indiffusing step.

Other features which are considered as characteristic for the invention are set forth in the appended claims.

Although the invention is illustrated and described herein as embodied in a power semiconductor and a fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a diagrammatic, partial sectional view through a silicon wafer with structures for a power semiconductor according to the invention.

DESCRIPTION OF THE PREFERRED EMBODIMENTS

Referring now to the single FIGURE of the drawing in detail, there is shown a cross section through a silicon wafer at a detail where two power semiconductors 1a and 1b that are later to be separated are formed together with their edge regions. An intended separating line 2 is depicted by a dashed line and the edge regions of the power semiconductors 1a and 1b are constructed mirror-symmetrically with respect to the separating line 2, so that only the construction of the edge region to the left of the separating line 2 from the power semiconductor 1a need be described below.

The detail illustrated also shows merely the edge regions of the power semiconductor 1a where in principle no contacts, gate configurations and the like are provided, as are necessary and known in power components in which the configuration of the present invention that is to be described can be used. Examples of such power components are, for example insulated gate bipolar transistors (IGBTs), thyristors, gate turn-off thyristors (GTO) etc.

According to the FIGURE, the edge region of the power semiconductor 1a which blocks from both sides is formed in a silicon semiconductor substrate 20. An n-doped anode 3 is disposed on an underside of the substrate 20, a lightly p-doped base zone 4 is disposed in the substrate 20, a second base zone 5 having higher n-type doping is provided, and an edge termination 6 toward a surface 7 of the power semiconductor 1a is provided, which is formed for a forward blocking capability of the power semiconductor 1a. An n-doped edge termination 9 for a reverse blocking capability is provided in such a way that it is disposed spaced apart from the edge termination 6 by a distance 8 corresponding approximately to a substrate thickness of the semiconductor substrate 20.

According to the invention, a sulfur-doped or selenium-doped separation diffusion zone 10 now leads from the n-doped emitter region 3 provided on the underside through the semiconductor substrate 20 to the edge termination 9 and in this case produces an ohmic connection between the edge termination for the reverse blocking capability 9 and the n-doped underside region 3 as a result of the donor properties of the sulfur or selenium introduced into the silicon substrate 20.

The semiconductor described can, for example, be fabricated as now described.

In the course of fabrication, the required semiconductor structures such as gate terminals, emitters, collectors, etc., are provided in the silicon wafer 20. At the same time, the edge terminations 6 and 9 are realized in a known manner, for example by field rings, field plates and/or, as shown, by a VLD structure in a manner known per se on the surface of the power semiconductor, that is to say on the cathode side.

A masking is then applied to the substrate 20 at those locations at which the separation diffusion is intended to be produced. The width of the regions left free by the masking is sufficient such that the components 1a and 1b can later readily be separated in the middle of the region along the line 2 and a width transversely with respect to the connection line of approximately three to four penetration depths of the space charge zone into the sulfur-doped or selenium-doped zone 10 is nevertheless provided at the remaining edge. Therefore, a width of approximately 100 to 200 $\mu$m is typically chosen for this.

A quantity of approximately $10^{14}$ to $10^{16}$ dopant atoms per square centimeter is then implanted on both sides of the silicon wafer and the masking is stripped off.

The wafer is subsequently heated to a temperature of 1200° C. until the dopant fronts indiffusing into the silicon from both sides have run into one another.

After cooling, the wafer can be sawn along the line 2 and contact can be made with the component in a customary manner.

In the case of power semiconductors having small penetration depths of the pn-junctions of the more highly doped base zone and of the emitters, it is recommended, by contrast, to provide the separation diffusion by dopant atoms and only then to produce the emitters and the more highly doped base zone. In some cases, it may even be expedient to integrate the masked implantation into the process for fabricating the power semiconductor in such a way that some of the high-temperature processes required for fabricating the base and emitter structures are concomitantly used for indiffusion of the dopant atoms.

I claim:

1. A power semiconductor, comprising:
   a substrate having a top side and an underside;
   an n-doped anode disposed on one of said top side and said underside;
   an n-doped cathode disposed on the other of said top side and said underside;
   a p-doped base zone disposed adjacent and between said anode and said cathode, said base zone being more lightly doped than said n-doped cathode;
   edge terminations disposed on said top side; and
   at least one n-doped region disposed in said substrate and extending from one of said edge terminations on said top side to said underside of said substrate, and said doped region being continuously one of sulfur-doped and selenium-doped.

2. The power semiconductor according to claim 1, wherein said edge terminations are disposed only on said top side.

3. The power semiconductor according to claim 1, wherein at least one of said edge terminations is formed by doping with a lateral concentration variation.

4. The power semiconductor according to claim 1, wherein said doped region extends to said one of said edge terminations intended for obtaining a reverse blocking capability.

5. The power semiconductor according to claim 1, wherein said doped region is disposed at an edge of the power semiconductor.

6. The power semiconductor according to claim 1, wherein said substrate has a sawing line defined thereon, and said doped region is disposed at said sawing line of said substrate.

7. The power semiconductor according to claim 1, wherein said doped region extends in a transverse direction by at least twice a penetration depth of a space charge zone into said doped region.

8. The power semiconductor according to claim 1, wherein said doped region is doped so highly that an ohmic connection is produced with, in comparison with its surroundings, an appreciable conductivity between said one of said edge terminations and said underside of said substrate.

9. The power semiconductor according to claim 1, wherein said doped region is formed by indiffusion of an implantation dose of between $10^{14}$ and $10^{16}$ dopant atoms per square centimeter.

10. The power semiconductor according to claim 1, including a more highly doped base zone being n-doped and disposed in said substrate.

11. The power semiconductor according to claim 1, wherein said cathode is a cathodal emitter and said anode is an anodal emitter.

12. The power semiconductor according to claim 1, wherein said edge terminations are disposed on a side of said substrate containing said cathode.

13. The power semiconductor according to claim 1, wherein said substrate is composed of silicon.

14. The power semiconductor according to claim 1, wherein all of said edge terminations are formed by doping with a lateral concentration variation.

15. The power semiconductor according to claim 1, wherein said doped region extends in a transverse direction by at least three times a penetration depth of a space charge zone into said doped region.

16. The power semiconductor according to claim 1, wherein said doped region extends in a transverse direction by at least four times a penetration depth of a space charge zone into said doped region.

17. A method for fabricating a power semiconductor, which comprises the steps of:

providing a substrate being a planar silicon substrate;

forming an n-doped anode on one of a top side and an underside of the substrate;

forming an n-doped cathode on the other of the top side and the underside of the substrate;

forming a p-doped base zone adjacent and between the anode and the cathode, the base zone being more lightly doped than the cathode;

providing edge terminations for both blocking directions on the top side of the substrate; and forming a n-doped connection connecting a semiconductor region on the underside to an edge termination on the top side, forming the connection from dopant atoms selected from the group consisting of sulfur atoms and selenium atoms being indiffused into the substrate.

18. The method according to claim 17, which comprises indifussing an implantation dose of $10^{14}$ to $10^{16}$ dopant atoms into the substrate for forming the connection.

19. The method according to claim 17, which comprises indifussing the dopant atoms into the substrate from both substrate sides.

20. The method according to claim 17, which comprises indiffussing the dopant atoms at a temperature below 1240° C.

21. The method according to claim 17, which comprises indiffussing the dopant atoms at a temperature below 1200° C.

22. The method according to claim 17, which comprises indiffussing the dopant atoms at a temperature below 1240° C. and during a time shorter than 50 hours.

23. The method according to claim 19, which comprises masking both of the substrate sides on which the dopant atoms are to be implanted using a masking layer.

24. The method according to claim 23, which comprises forming the masking layer from a material selected from the group consisting of silicon dioxide and photoresist.

25. The method according to claim 23, which comprises stripping off the masking layer before performing the indiffusing step.

* * * * *